United States Patent
Kolodny et al.

(10) Patent No.: US 9,659,650 B2
(45) Date of Patent: May 23, 2017

(54) MULTISTATE REGISTER HAVING A FLIP FLOP AND MULTIPLE MEMRISTIVE DEVICES

(71) Applicants: Technion Research and Development Foundation LTD., Haifa (IL); UNIVERSITY OF ROCHESTER

(72) Inventors: Avinoam Kolodny, Haifa (IL); Shahar Kvatinsky, Ramat Gan (IL); Ravi Patel, Victor, NY (US); Eby Friedman, Rochester, NY (US)

(73) Assignee: TECHNION RESEARCH & DEVELOPEMENT FOUNDATION LTD., Haifa (IL)

( * ) Notice: Subject to any disclaimer, the term of this patent is extended or adjusted under 35 U.S.C. 154(b) by 0 days.

(21) Appl. No.: 15/119,185

(22) PCT Filed: Feb. 17, 2015

(86) PCT No.: PCT/IL2015/050175
§ 371 (c)(1),
(2) Date: Aug. 16, 2016

(87) PCT Pub. No.: WO2015/121868
PCT Pub. Date: Aug. 20, 2015

(65) Prior Publication Data
US 2017/0011797 A1    Jan. 12, 2017

Related U.S. Application Data

(60) Provisional application No. 61/940,499, filed on Feb. 17, 2014.

(51) Int. Cl.
*G11C 11/00*    (2006.01)
*G11C 13/00*    (2006.01)
(Continued)

(52) U.S. Cl.
CPC ...... *G11C 13/0069* (2013.01); *G06F 9/30101* (2013.01); *G11C 13/0004* (2013.01);
(Continued)

(58) Field of Classification Search
CPC .............. G11C 13/0069; G11C 13/004; G11C 13/0004; G11C 13/0007; H01L 27/24
(Continued)

(56) References Cited

U.S. PATENT DOCUMENTS 5,768,287 A * 6/1998 Norman ............... G11C 7/1039
714/719
6,728,825 B1 * 4/2004 Norman ................. G11C 11/56
365/185.03
(Continued)

*Primary Examiner* — Pho M Luu
(74) *Attorney, Agent, or Firm* — Reches Patents

(57) ABSTRACT

A multistate register, comprising: a flip-flop that comprises a first latch, a second latch and an intermediate gate coupled between the first and second latches; multiple memristive devices; and an interface coupled between the multiple memristive devices and the flip-flop; wherein the multistate register is arranged to operate in a memristive device write mode, in a memristive device read mode and in a flip-flop mode; wherein when operating in the memristive device read mode, the interface is arranged to write to a first selected memristive device of the multiple memristive devices a first logic value stored in the first latch; wherein when operating in the memristive device write mode, the interface is arranged to write to the second latch a second logic value stored in a second selected memristive device of the multiple memristive devices; and wherein when operating on a flip-flop mode logic the interface is prevented from transferring values between the flip flop and the memristive devices.

16 Claims, 8 Drawing Sheets

(51) Int. Cl.
*G06F 9/30* (2006.01)
*H01L 27/24* (2006.01)

(52) U.S. Cl.
CPC ........ *G11C 13/004* (2013.01); *G11C 13/0007* (2013.01); *H01L 27/24* (2013.01)

(58) Field of Classification Search
USPC ........................................................ 365/148
See application file for complete search history.

(56) References Cited

U.S. PATENT DOCUMENTS 6,985,388 B2 * 1/2006 Cernea ................. G11C 7/1036
                                                             365/189.05
9,484,097 B2 * 11/2016 Kim .................... G11C 11/5628

* cited by examiner

MULTISTATE REGISTER HAVING A FLIP FLOP AND MULTIPLE MEMRISTIVE DEVICES

RELATED APPLICATIONS

This application claims priority from U.S. provisional patent Ser. No. 61/940,499 filing date Feb. 17, 2014 that is incorporated herein by reference.

BACKGROUND

Memristive technologies have been proposed to augment existing state-of-the-art CMOS circuits. Memristive device based memories can be integrated with existing digital circuits to increase functionality and system throughput. Memristive devices are two terminal devices that exhibit the properties of nonvolatility and high density. Unlike charge-based memories, information in an memristive devices are stored by modulating the material state or device state. A memristive device cell dissipates no static power to store a state and provides immunity to radiation and noise induced soft errors. Many candidate memristive devices exist such as RRAM, STT-MRAM, PCM, CBRAM, etc. Fabrication of these devices generally requires deposition of a thin film materials and is often compatible with existing CMOS manufacturing processes. The integration of these devices with CMOS is constrained primarily by lithographic patterning limits. Thus memristive devices scale with existing CMOS technologies.

The traditional approach of increasing CPU clock frequency has abated due to constraints on power consumption and density. To increase performance with each CMOS generation, thread-level parallelism has been exploited with multi-core processors. This approach utilizes an increasing number of CMOS transistors to support additional cores on the same die, rather than increase the frequency of a single processor. This increase in the number of cores, however, has increased the static power. Multithreading is an approach to enhance the performance of an individual core by increasing logic utilization. Handling each thread, however, requires duplication of resources (e.g., register files, flags, pipeline registers). This added overhead increases the area, power, and complexity of the processor and potentially increases the on-chip signal delay. The thread count is therefore typically limited to two to four threads per core in modern general purpose processors.

SUMMARY OF THE INVENTION

According to an embodiment of the invention various methods may be provided and are described in the specification. Additional embodiments of the invention include a device that may be arranged to execute any or all of the methods described in the specification above, including any stages-and any combinations of same.

According to an embodiment of the invention there may be provided a multistate register that may include a flip-flop that may include a first latch, a second latch and an intermediate gate coupled between the first and second latches; multiple memristive devices; and an interface coupled between the multiple memristive devices and the flip-flop; wherein the multistate register may be arranged to operate in a memristive device write mode, in a memristive device read mode and in a flip-flop mode; wherein when operating in the memristive device read mode, the interface may be arranged to write to a first selected memristive device of the multiple memristive devices a first logic value stored in the first latch; wherein when operating in the memristive device write mode, the interface may be arranged to write to the second latch a second logic value stored in a second selected memristive device of the multiple memristive devices; and wherein when operating on a flip-flop mode logic the interface is prevented from transferring values between the flip flop and the memristive devices.

The interface may include a read circuit and a portion of a write circuit, wherein another portion of the write circuit is a first inverter of the second latch.

The first inverter of the second latch and a group of up to five transistors may be arranged to write to the second latch the second logic value stored in the second selected memristive device.

The multiple memristive devices may be arranged in a crossbar formation.

The multiple memristive devices may be arranged in a two-dimensional array and wherein the interface may include row select gates and column select gates.

The multiple memristive devices may be arranged in a single dimension array and wherein the interface may include a set of select gates.

The interface may include isolating gates for isolating the multiple memristive devices from the flip-flop when operating in the flip-flop mode.

There may be provided according to an embodiment of the invention a device that may include a plurality of multistate registers; wherein each multistate register may include (a) a flip-flop that may include a first latch, a second latch and an intermediate gate coupled between the first and second latches; (b) multiple memristive devices; and (c) an interface coupled between the multiple memristive devices and the flip-flop; wherein the multistate register may be arranged to operate in a memristive device write mode, in a memristive device read mode and in a flip-flop mode; wherein when operating in the memristive device read mode, the interface may be arranged to write to a first selected memristive device of the multiple memristive devices a first logic value stored in the first latch; wherein when operating in the memristive device write mode, the interface may be arranged to write to the second latch a second logic value stored in a second selected memristive device of the multiple memristive devices; and wherein when operating on a flip-flop mode the interface is prevented from transferring values between the flip flop and the memristive devices; combinational logics; wherein the combinational logics and flip-flops of the plurality of the multistate registers, when operating in a flip flop mode, may be arranged to execute a first thread of instructions; wherein the multiple memristive devices of the plurality of multistate registers may be arranged to store a state of another thread of instructions that differs from the first thread of instructions; and a control circuit that may be arranged to control a thread switch between the first thread of instructions and the other thread of instructions by (a) operating the plurality of multistate registers in a read mode for storing a state of the first thread of instructions and by (b) operating the plurality of multistate registers in a write mode for storing in the flip-flops a state of the other thread of instructions; wherein the combinational logics and the flip-flops of the plurality of the multistate registers, when operating in the flip flop mode, may be arranged to execute the other thread of instructions.

Each interface may include a read circuit and a portion of a write circuit, wherein another portion of the write circuit is a first inverter of a second latch coupled to the interface.

Each first inverter of each second latch and a group of up to five transistors may be arranged to write to each second latch each second logic value stored in each second selected memristive device.

The multiple memristive device of each multistate register may be arranged in a crossbar formation.

The multiple memristive devices of each multistate register may be arranged in a two-dimensional array and wherein each interface may include row select gates and column select gates.

The multiple memristive devices of each multistate register may be arranged in a single dimension array and wherein each interface may include a set of select gates.

Each interface may include isolating gates for isolating the multiple memristive devices from the flip-flop when operating in the flip-flop mode.

The multiple memristive devices may include spin torque transfer magnetoresistive memory elements.

The multiple memristive devices may include resistive memory elements.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
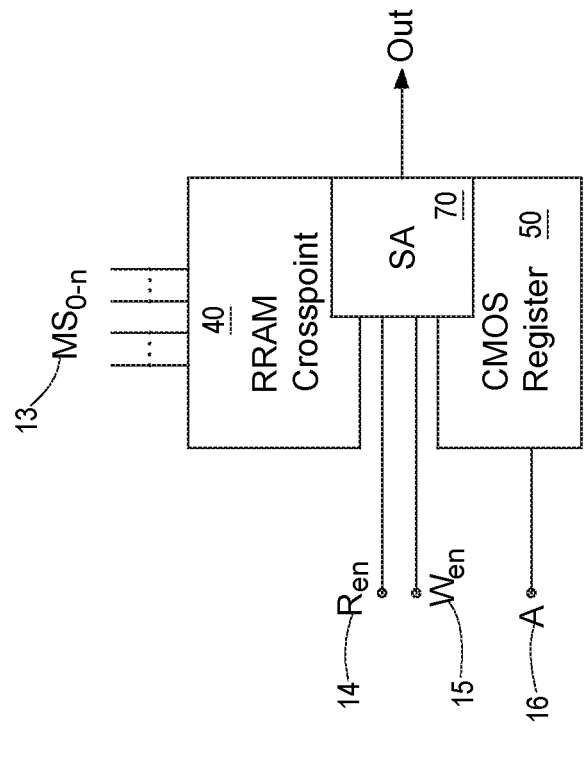
FIG. 1 illustrates a multistate register according to an embodiment of the invention.
Figure 1:
Figure 1:
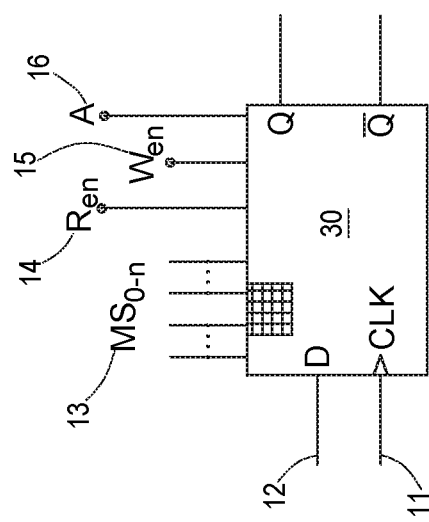

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

The following example may refer to non-limiting types of memristive devices and memristive device arrangements. The suggested methods and devices are not limited to these non-limiting examples. For example any reference to an RRAM crossbar may represent any arrangement of multiple memristive devices.

There is provided a multistate register that is different than conventional types of memory, and used to store multiple data bits, where only a single bit is active and the remaining data bits are idle. The active bit may be stored within a flip flop such as a CMOS flip flop, while the idle bits are stored in multiple memristive devices that may form a memristive RRAM crossbar or alternate memory topology that is co-located with the flip flop.

There may be provided a multistate register, that may include (a) a flip-flop that may include a first latch (also referred to as input latch), a second latch (also referred to as output latch) and an intermediate gate coupled between the first and second latches; (b) multiple memristive devices (that may be arranged in a one-dimensional array, a two dimensional array or any other arrangement); and (c) an interface coupled between the multiple memristive devices and the flip-flop (the interface may include control gates, logic components, multiplexers, de-multiplexers and the like).

The multistate register is arranged to operate in a memristive device write mode, in a memristive device read mode and in a flip-flop mode. Control signals (such as control signal A of FIGS. 1-2, Ren and Wen control signals) can induce the multistate register to enter in each of these modes and control its operation when in these modes.

When operating in the memristive device read mode, the interface is arranged to write to a first selected memristive device of the multiple memristive devices a first logic value stored in the first latch. The first memristive device is selected by the control signals MS0-n.

When operating in the memristive device write mode, the interface is arranged to write to the second latch a second logic value stored in a second selected memristive device of the multiple memristive devices. The second selected memristive device is selected by the control signals MS0-n.

When operating on a flip-flop mode logic the interface is prevented from transferring values between the flip flop and the memristive devices.

The interface may include a read circuit and a portion of a write circuit (see, for example transistors 61-65 of FIGS. 3-4), wherein another portion of the write circuit is a first inverter (denoted 54 in FIGS. 3-4) of the second latch.

The multistate register may be used to store multiple bits in a single logic gate.

Figure 2:
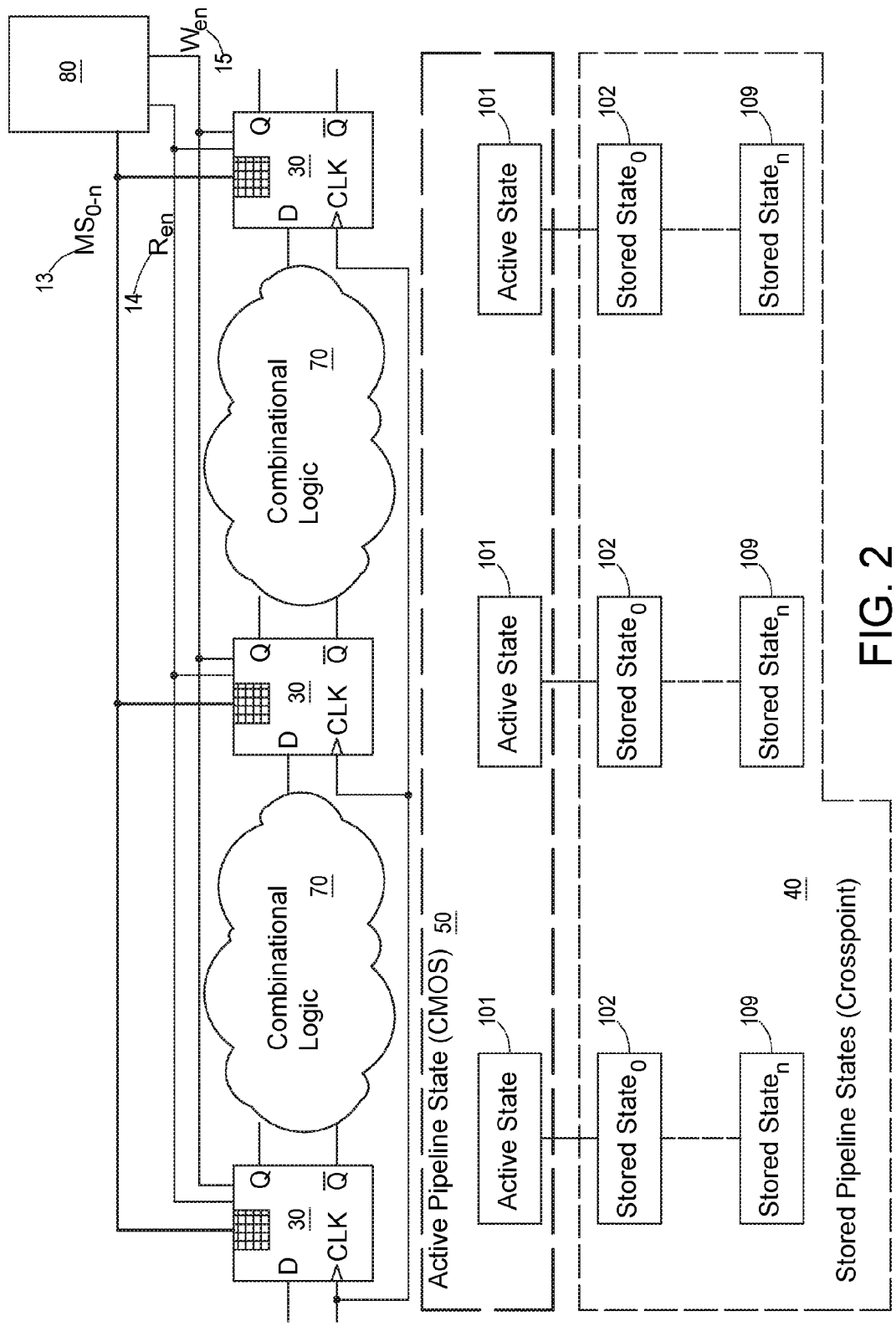
FIG. 2 illustrates a system and multiple state information stored in the multistate registers of the system according to an embodiment of the invention.
Figure 3:
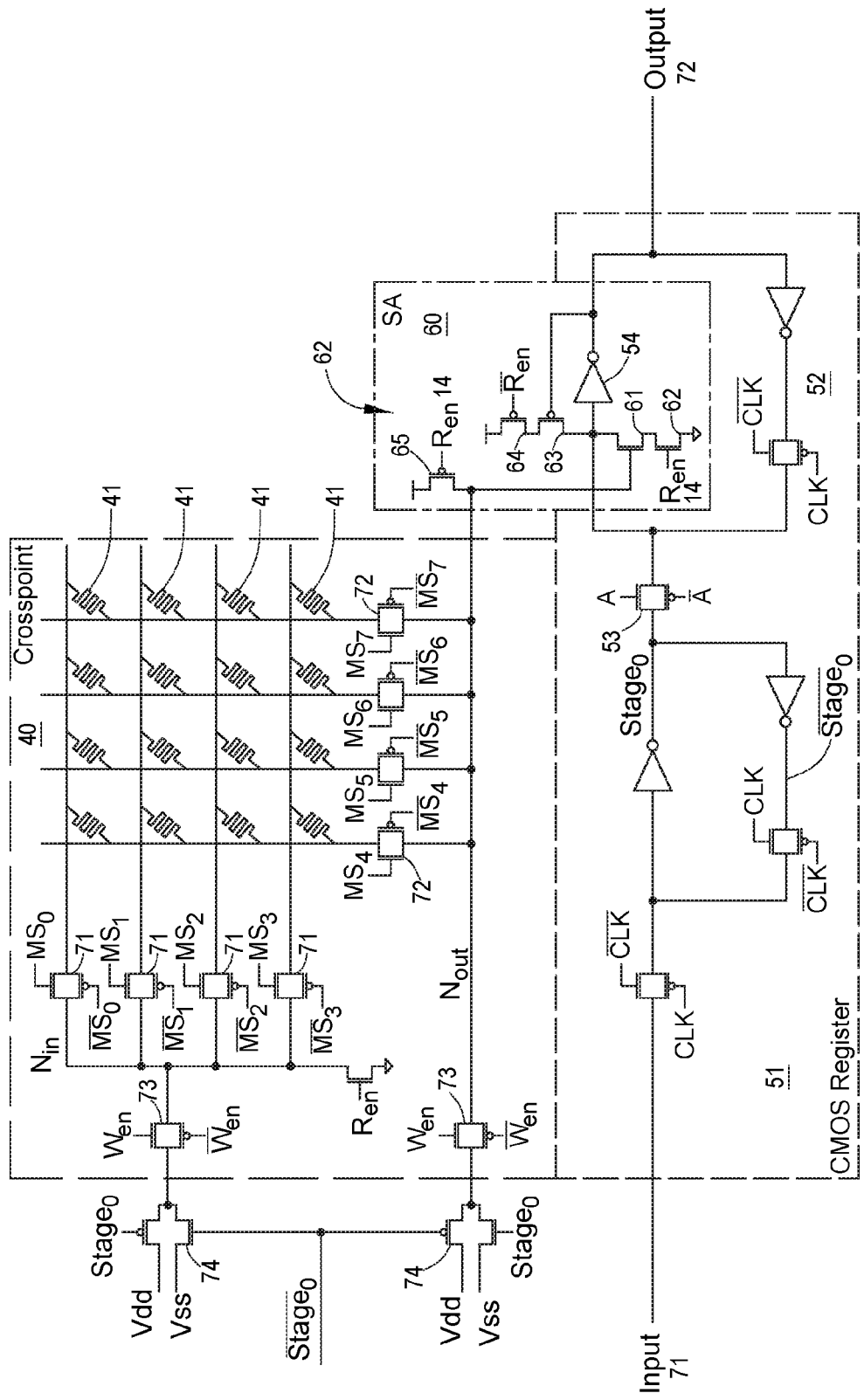
FIG. 3 illustrates a multistate register according to an embodiment of the invention.

The multistate register may be "drop-in" compatible with existing CMOS based flip flops. To maintain this criterion, the multistate register may utilize a clocked multistate register augmented by additional sense circuitry (SA) and global memristive device select (MS) lines. The symbol and topology of the multistate register are shown in FIGS. 1-3. Multistate registers can be used as pipeline registers within a processor pipeline, as shown in FIG. 2.

Referring to FIGS. 1-3—the MS lines (MS0-MSn) may select individual memristive devices (denoted 41 in FIGS. 3 and 4) within a crosspoint memory 40 co-located with the multistate register 30.

Signals $W_{en}$ and $R_{en}$ 14 and 15 of FIGS. 1-3 are global control signals that, respectively, signal write and read within the local crosspoint memory.

Signal A 16 sets the multistate register 30 into an intermediate state that facilitates write and read from the crosspoint—during a memristive device write mode and a memristive device read mode. Gates within the multistate register are reconfigured to provide a built-in sense amplifier for the crosspoint, and the overhead of the additional circuitry (transistors 62 of FIG. 3) is relatively small. FIG. 3 illustrates a set of five transistors that in addition to a first inverter 54 of second latch 52 form a sense amplifier.

The multistate register primarily operates as a CMOS register. When operating in a flip-flop mode, the structure may behave as a standard D flip flop, where a single bit is stored and is active while idle states are stored in the crosspoint array. In this mode multistate registers 30 are arranged to store the states of combinational logics (denoted 70 in FIG. 2) that are coupled between these multistate registers 30.

When global control circuitry triggers a switch of the pipeline state (e.g., for a pipeline stall or context switch), the circuit stores the current bit of the register and reads out the value of the next active bit from the internal RRAM-based storage.

The operation of switching between active bits includes two phases in which the multistate register is first operated at a memristive device write mode in which a RRAM write operation stores the current state of the register.

During a write operation, the transmission gate A disconnects the first stage from the following stage, isolating the structure into two latches. The input latch 51 stores the currently evaluated state, while the output latch 52 stores the data of the previous state. Once $W_{en}$ 14 goes high, the input latch 51 drives a pair of multiplexors (formed by row gates 71 and column gates 72) that write the currently stored state into the RRAM cell selected by the global MS lines. The write phase may require more than half a clock cycle depending upon the switching time of the RRAM technology.

During the second phase the multistate register operates in a memristive device write mode and a new active bit is selected in the resistive crosspoint 40 and sensed by the output stage (first inverter 54 of the output latch 52) of the CMOS D flip flop. During a write operation, the globally selected row is grounded through the common node $N_{in}$ signal provided to row gates 71. The voltage on the common line $N_{out}$ is set by the state of the RRAM cell. To bias the RRAM cell, the common line is connected through a PMOS transistor to the supply voltage $V_{DD}$. The voltage is sensed at the output of $M_1$ .63 If $R_{en}$ 14 is set high, $M_1$ to $M_5$ 61-65 reconfigure the last inverter stage 54 as a single ended sense amplifier, and the crosspoint is read.

Figure 4:
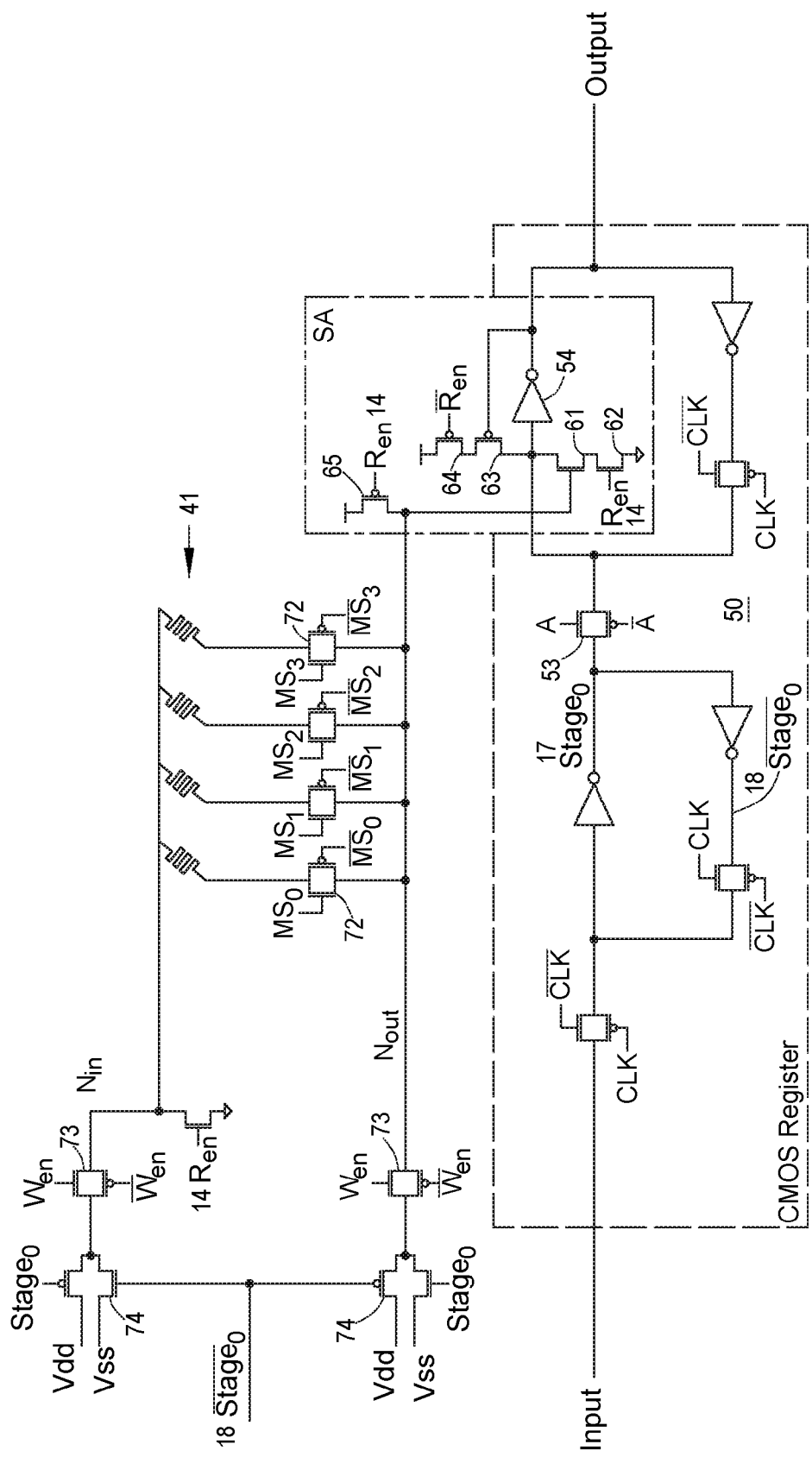
FIG. 4 illustrates a multistate register according to an embodiment of the invention.

FIG. 4 illustrates a multistate register 10 in which the two dimensional crossbar of memristive devices there is a one dimensional array (for example—row) of memristive devices. The memristive devices may be RRAM, PCM, STT MRAM, and the like. This topology may be suitable especially for STT MRAM—it has lower capacity, but better robustness.

Figure 7:
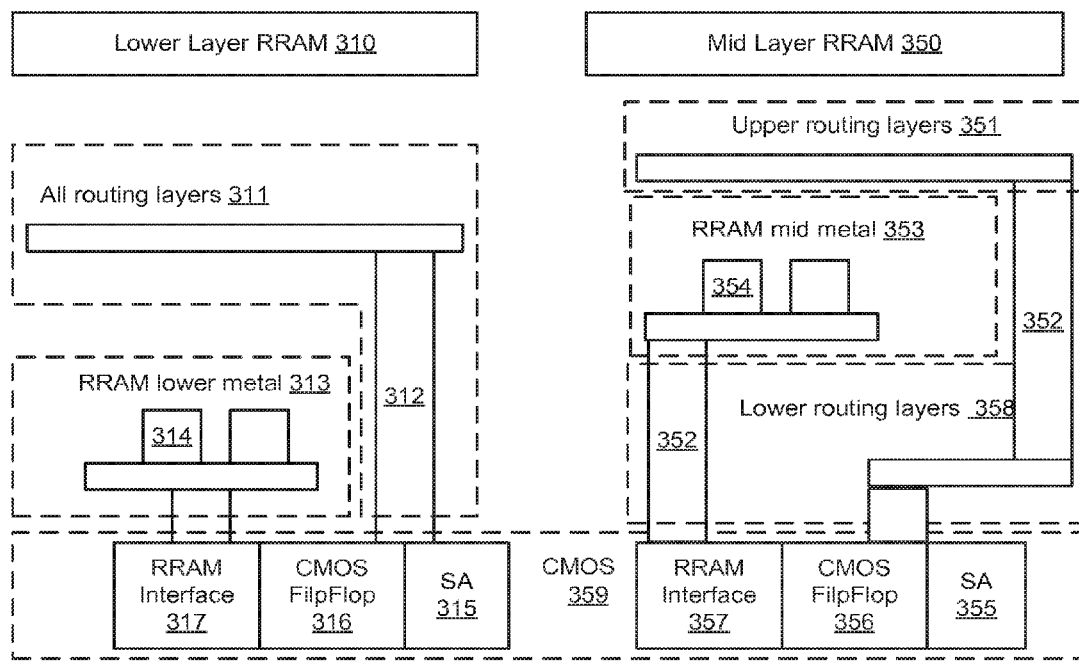
FIG. 7 illustrates a vertical layout of a memristive device within a multistate register according to an embodiment of the invention.

The physical design of the multistate register can be achieved by two approaches. RRAM devices can be integrated between the first two metals, as illustrated in the left side of FIG. 7 (Denoted lower layer RRAM 310), or the RRAM can be integrated on the middle level metal layers (denoted mid layer RRAM 351), as shown in the right side of FIG. 7. The middle metal layer approach allows the RRAM to be integrated above the CMOS circuitry, saving additional area.

The lower layer RRAM 310 includes (from top to bottom) all routing layers 311, RRAM lower matal layers 314 (that include metal structures 315) in parallel to via 313 (included in all routing layers), and CMOS layer 319 that include RRAM interface 318, CMIS flip flop 317 and sense amplifier 316.

The mid layer RRAM 350 includes (from top to bottom) all routing layers 351, RRAM mid metal 355 (that include metal structures 355) in parallel to an upper portion of via 353 (included in all routing layers), lower routing layers 358 (in parallel to the lower portion of via 353) and CMOS layer 359 that include RRAM interface 358, CMIS flip flop 357 and sense amplifier 356.

Figure 8:
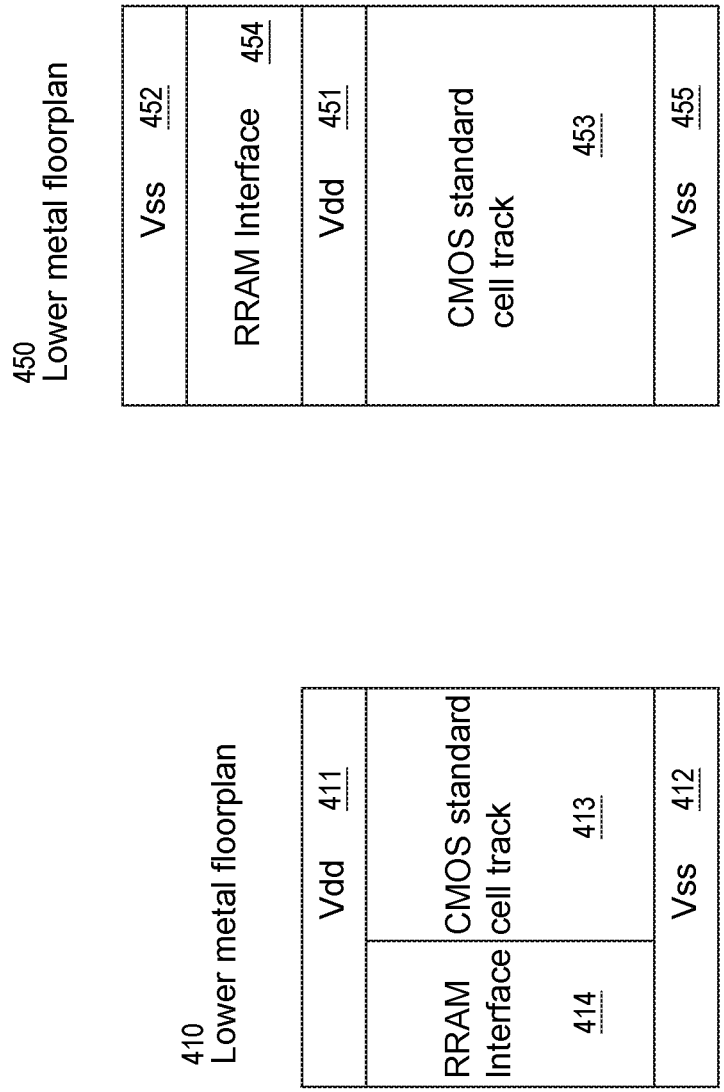
FIG. 8 illustrates a planar floor plan of multistate register with lower metal and upper metal RRAM layers according to an embodiment of the invention.

A mid floor cell floorplan 450 is shown in the right side of FIG. 8, where a dedicated track of Vss 452 is provided for the RRAM interface circuitry 454. This dedicated track runs parallel to the CMOS track 453. There is also a another Vss track 455 and a Vdd track 451.

The lower metal floorplan shown in the left side of FIG. 8, where the RRAM is integrated on the lower metal layers, requires slightly more area but is compatible with standard cell CMOS layout conventions. Fabrication on the lower levels maintains standard routing conventions, where the lower metal layers are dedicated to routing within gates, and the middle metal layers are used to route among gates. It includes Vdd track 411 and Vss track 412 that are parallel to each other and are located on both sides of the RRAM interface 414 and a CMOS standard cell track 413.

Figure 5:
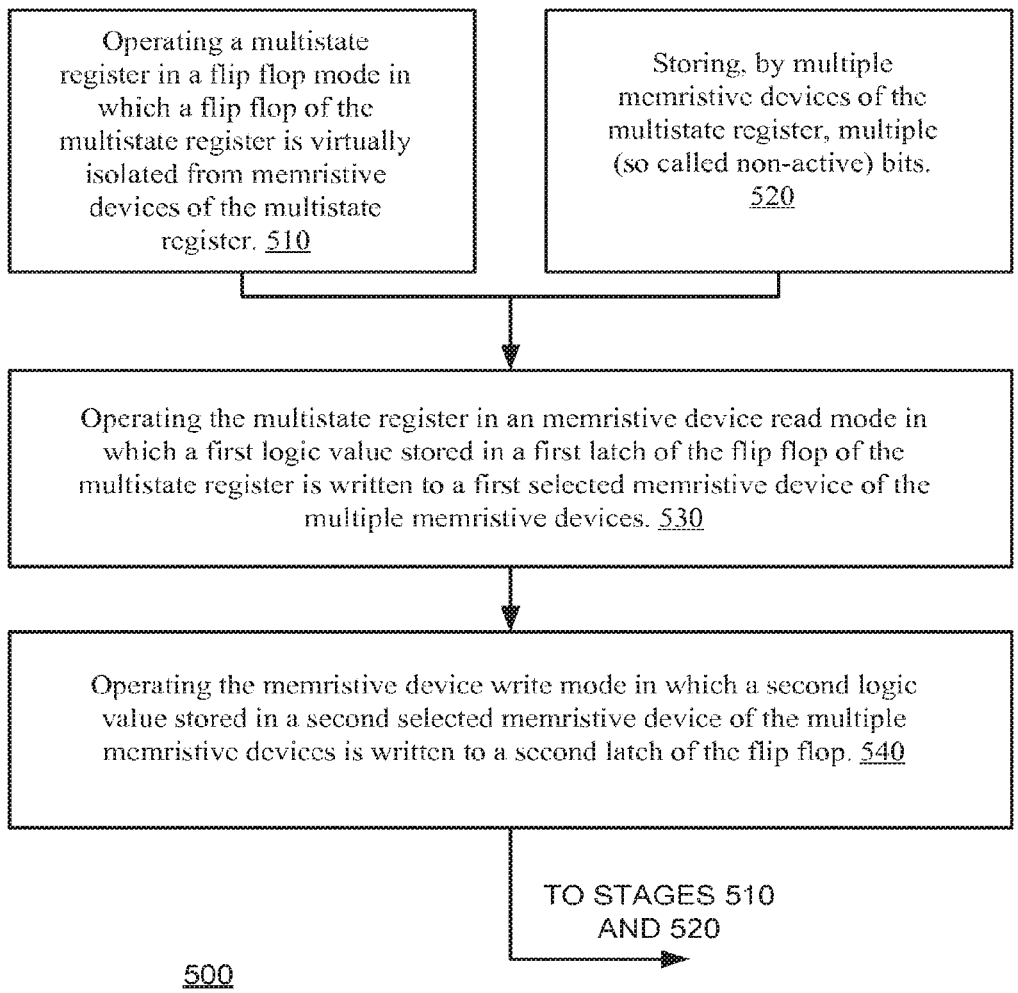
FIG. 5 illustrates a method according to an embodiment of the invention.

FIG. 5 illustrates method 500 according to an embodiment of the invention.

Method 500 may start by stages 510 and 520.

Stage 510 may include operating a multistate register in a flip flop mode in which a flip flop of the multistate register is virtually isolated from memristive devices of the multistate register.

Stage 520 may include storing, by multiple memristive devices of the multistate register, multiple (so called nonactive) bits.

Stage 510 and 520 may be followed by stage 530 of operating the multistate register in an memristive device read mode in which a first logic value stored in a first latch of the flip flop of the multistate register is written to a first selected memristive device of the multiple memristive devices.

Stage 530 is followed by stage 540 of operating the memristive device write mode in which a second logic value stored in a second selected memristive device of the multiple memristive devices is written to a second latch of the flip flop.

Stage 540 is followed by stages 510 and 520.

According to an embodiment of the invention there is provided a device 100 that includes a plurality of multistate registers (see multistate registers 30 of FIG. 2), combinational logics (referred to as combinational logic 70 in FIG. 2) and control circuit (denoted 80 in FIG. 2).

Each multistate register 30 may include (a) a flip-flop that comprises a first latch, a second latch and an intermediate gate coupled between the first and second latches; (b) multiple memristive devices; and (c) an interface coupled between the multiple memristive devices and the flip-flop; wherein the multistate register is arranged to operate in a memristive device write mode, in a memristive device read mode and in a flip-flop mode; wherein when operating in the memristive device read mode, the interface is arranged to write to a first selected memristive device of the multiple memristive devices a first logic value stored in the first latch; wherein when operating in the memristive device write mode, the interface is arranged to write to the second latch a second logic value stored in a second selected memristive device of the multiple memristive devices; and wherein when operating on a flip-flop mode the interface is prevented from transferring values between the flip flop and the memristive devices.

The combinational logics 70 and the multistate registers 30 may support thread switches.

The combinational logics and flip-flops of the plurality of the multistate registers, when operating in a flip flop mode, are arranged to execute a first thread of instructions.

The multiple memristive devices of the multistate register are arranged to store a state of another thread of instructions that differs from the first thread of instructions.

The control circuit 80 is arranged to control a thread switch between the first thread of instructions and the other thread of instructions by (a) operating the plurality of multistate registers in a read mode for storing a state of the first thread of instructions and by (b) operating the plurality of multistate registers in a write mode for storing in the flip-flops a state of the other thread of instructions. FIG. 2 illustrates the so-called active state (a state of a currently executed thread) 101 that is stored in the flip flop and additional stored states (states of other threads) 102-109 that are stored in the memristive devices of the different multistate registers 30.

The combinational logics and the flip-flops of the plurality of the multistate registers, when operating in the flip flop mode, are arranged to execute the other thread of instructions.

Figure 6:
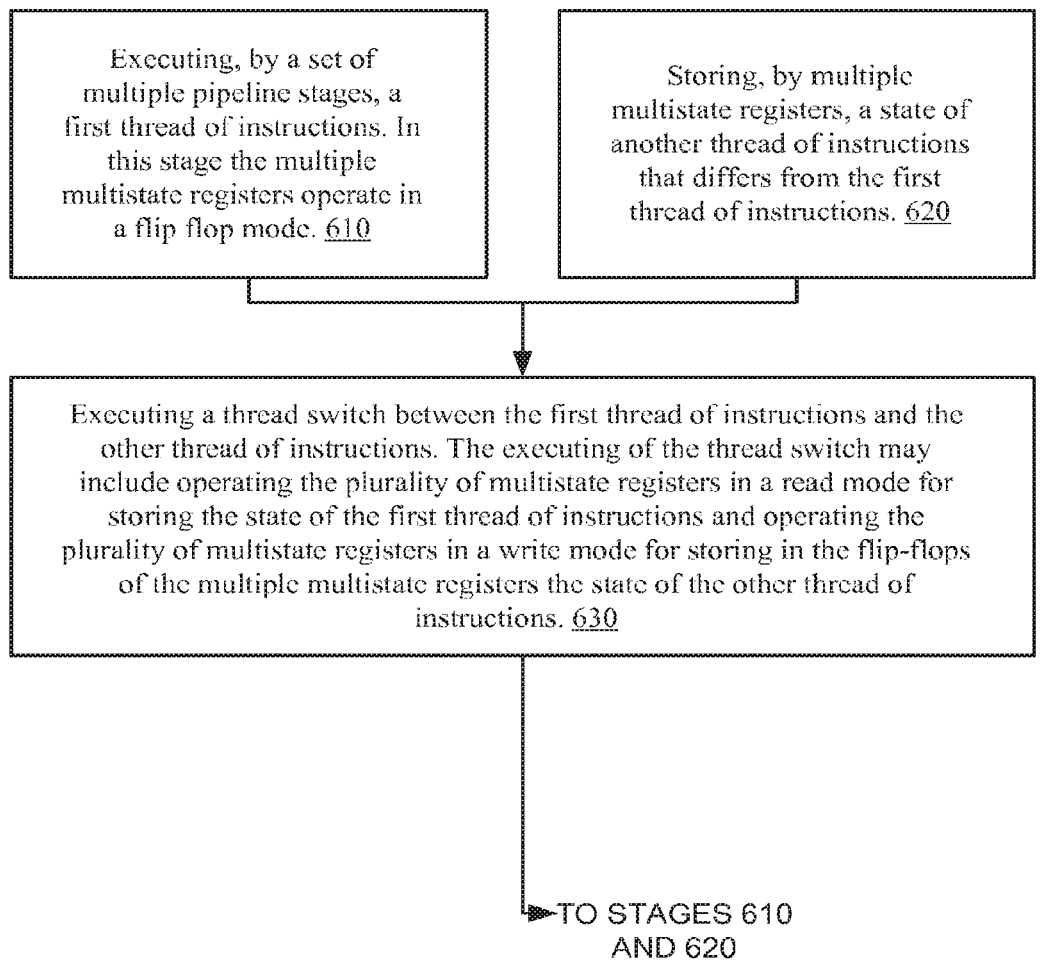
FIG. 6 illustrates a method according to an embodiment of the invention and a prior art device.

FIG. 6 illustrates method 600 according to an embodiment of the invention.

Method 600 may start by stages 610 and 620.

Stage 610 may include executing, by a set of multiple pipeline stages, a first thread of instructions. In this stage the multiple multistate registers operate in a flip flop mode.

Stage 620 may include storing, by multiple multistate registers, a state of another thread of instructions that differs from the first thread of instructions.

Stage 610 and 620 may be followed by stage 630 of executing a thread switch between the first thread of instructions and the other thread of instructions. The executing of the thread switch may include operating the plurality of multistate registers in a read mode for storing the state of the first thread of instructions and by operating the plurality of multistate registers in a write mode for storing in the flip-flops of the multiple multistate registers the state of the other thread of instructions.

Stage 630 is followed by stage 610 and 620 wherein the other thread of instructions (that state of which was fed to the pipeline stages) becomes the first thread (or active thread) of instructions and the previously active thread (previously first thread) becomes an inactive thread (another thread).

Stage 630 may include executing a thread switch between any thread of instructions out of the first thread of instructions and the multiple other threads of instructions.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components.

Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A multistate register, comprising:
   a flip-flop that comprises a first latch, a second latch and an intermediate gate coupled between the first and second latches;
   multiple memristive devices; and
   an interface coupled between the multiple memristive devices and the flip-flop;
   wherein the multistate register is arranged to operate in a memristive device write mode, in a memristive device read mode and in a flip-flop mode;
   wherein when operating in the memristive device read mode, the interface is arranged to write to a first selected memristive device of the multiple memristive devices a first logic value stored in the first latch;
   wherein when operating in the memristive device write mode, the interface is arranged to write to the second latch a second logic value stored in a second selected memristive device of the multiple memristive devices; and
   wherein when operating on a flip-flop mode logic the interface is prevented from transferring values between the flip flop and the memristive devices.

2. The multistate register according to claim 1 wherein the interface comprises a read circuit and a portion of a write circuit, wherein another portion of the write circuit is a first inverter of the second latch.

3. The multistate register according to claim 1 wherein a first inverter of the second latch and a group of up to five transistors are arranged to write to the second latch the second logic value stored in the second selected memristive device.

4. The multistate register according to claim 1 wherein the multiple memristive devices are arranged in a crossbar formation.

5. The multistate register according to claim 1 wherein the multiple memristive devices are arranged in a two-dimensional array and wherein the interface comprises row select gates and column select gates.

6. The multistate register according to claim 1 wherein the multiple memristive devices are arranged in a single dimension array and wherein the interface comprises a set of select gates.

7. The multistate register according to claim 1 wherein the interface comprises isolating gates for isolating the multiple memristive devices from the flip-flop when operating in the flip-flop mode.

8. A device, comprising:

a plurality of multistate registers;

wherein each multistate register comprises (a) a flip-flop that comprises a first latch, a second latch and an intermediate gate coupled between the first and second latches; (b) multiple memristive devices; and (c) an interface coupled between the multiple memristive devices and the flip-flop; wherein the multistate register is arranged to operate in a memristive device write mode, in a memristive device read mode and in a flip-flop mode; wherein when operating in the memristive device read mode, the interface is arranged to write to a first selected memristive device of the multiple memristive devices a first logic value stored in the first latch; wherein when operating in the memristive device write mode, the interface is arranged to write to the second latch a second logic value stored in a second selected memristive device of the multiple memristive devices; and wherein when operating on a flip-flop mode the interface is prevented from transferring values between the flip flop and the memristive devices;

combinational logics;

wherein the combinational logics and flip-flops of the plurality of the multistate registers, when operating in a flip flop mode, are arranged to execute a first thread of instructions;

wherein the multiple memristive devices of the plurality of multistate registers are arranged to store a state of another thread of instructions that differs from the first thread of instructions; and a control circuit that is arranged to control a thread switch between the first thread of instructions and the other thread of instructions by (a) operating the plurality of multistate registers in a read mode for storing a state of the first thread of instructions and by (b) operating the plurality of multistate registers in a write mode for storing in the flip-flops a state of the other thread of instructions;

wherein the combinational logics and the flip-flops of the plurality of the multistate registers, when operating in the flip flop mode, are arranged to execute the other thread of instructions.

9. The device according to claim 8 wherein each interface comprises a read circuit and a portion of a write circuit, wherein another portion of the write circuit is a first inverter of a second latch coupled to the interface.

10. The device according to claim 8 wherein each first inverter of each second latch and a group of up to five transistors are arranged to write to each second latch each second logic value stored in each second selected memristive device.

11. The device according to claim 8 wherein the multiple memristive device of each multistate register are arranged in a crossbar formation.

12. The device according to claim 8 wherein the multiple memristive devices of each multistate register are arranged in a two-dimensional array and wherein each interface comprises row select gates and column select gates.

13. The device according to claim 8 wherein the multiple memristive devices of each multistate register are arranged in a single dimension array and wherein each interface comprises a set of select gates.

14. The device according to claim 8 wherein each interface comprises isolating gates for isolating the multiple memristive devices from the flip-flop when operating in the flip-flop mode.

15. The device according to claim 8, wherein the each multiple memristive devices comprises spin torque transfer magnetoresistive memory elements.

16. The device according to claim 8, wherein the each multiple memristive devices comprises resistive memory elements.

* * * * *